(12) United States Patent
Winter et al.

(10) Patent No.: US 7,372,072 B2
(45) Date of Patent: May 13, 2008

(54) SEMICONDUCTOR WAFER WITH TEST STRUCTURE

(75) Inventors: Ramona Winter, Munich (DE); Susanne Lachenmann, Munich (DE); Valentin Rosskopf, Poettmes-Schorn (DE); Sibina Sukman-Praehofer, Munich (DE)

(73) Assignee: Infineon Technologies AG, Munich (DE)

( * ) Notice: Subject to any disclaimer, the term of this patent is extended or adjusted under 35 U.S.C. 154(b) by 214 days.

(21) Appl. No.: 11/304,074

(22) Filed: Dec. 15, 2005

(65) Prior Publication Data

US 2006/0157700 A1 Jul. 20, 2006

(30) Foreign Application Priority Data

Dec. 15, 2004 (DE) .................... 10 2004 060 369

(51) Int. Cl.
*H01L 21/301* (2006.01)
(52) U.S. Cl. .................. 257/48; 257/E21.524; 438/11; 438/18; 438/462
(58) Field of Classification Search ............... 257/48, 257/E21.524; 438/11, 18, 462, FOR. 142
See application file for complete search history.

(56) References Cited

U.S. PATENT DOCUMENTS

| 5,059,899 | A | | 10/1991 | Farnworth et al. |
| 5,627,101 | A | | 5/1997 | Lin et al. |
| 5,654,588 | A | * | 8/1997 | Dasse et al. ................ 257/754 |
| 5,838,163 | A | | 11/1998 | Rostoker et al. |
| 5,923,047 | A | | 7/1999 | Chia et al. |
| 5,942,766 | A | * | 8/1999 | Frei ........................... 257/48 |
| 6,124,143 | A | | 9/2000 | Sugasawara |
| 6,177,733 | B1 | | 1/2001 | Obara |
| 6,380,729 | B1 | * | 4/2002 | Smith ...................... 324/158.1 |
| 2001/0035762 | A1 | | 11/2001 | Sida |
| 2003/0006795 | A1 | | 1/2003 | Asayama et al. |
| 2003/0034558 | A1 | | 2/2003 | Umemura et al. |
| 2006/0113535 | A1 | * | 6/2006 | Lunde ......................... 257/48 |
| 2006/0131577 | A1 | * | 6/2006 | Cowles et al. ................ 257/48 |
| 2006/0157700 | A1 | * | 7/2006 | Winter et al. ................. 257/48 |
| 2006/0284174 | A1 | * | 12/2006 | Keller et al. ................. 257/48 |

FOREIGN PATENT DOCUMENTS

EP 0 856 794 A1 8/1998

(Continued)

*Primary Examiner*—George Fourson
(74) *Attorney, Agent, or Firm*—Slater & Matsil, L.L.P.

(57) ABSTRACT

The invention relates to a semiconductor wafer (1) having a plurality of first sawing regions (201-211) running parallel to one another in a first direction (X) and a plurality of second sawing regions (301-311) running parallel to one another in a second direction (Y), having useful regions (10) which in each case contain an integrated circuit (100) and which are in each case arranged between respective adjacent first sawing regions (201-211) and respective adjacent second sawing regions (301-311), and at least one test structure region arranged in the first sawing regions (201-211) and the second sawing regions (301-311) with test structures formed therein for checking electrical parameters of semiconductor elements. Connection contacts (51-54) connected to the test structures are provided in the test structure region, which connection contacts form a first row (R1) and a second row (R2), which in each case run in a longitudinal direction (L) and are offset relative to one another in the longitudinal direction (L) and transversely with respect to the longitudinal direction (L).

20 Claims, 7 Drawing Sheets

FOREIGN PATENT DOCUMENTS

| | | | |
|---|---|---|---|
| JP | 62081724 A | * | 4/1987 |
| JP | 01225138 A | * | 9/1989 |
| JP | 01276735 A | * | 11/1989 |
| JP | 02235356 A | * | 9/1990 |
| JP | 04360550 A | * | 12/1992 |
| JP | 06252234 A | * | 9/1994 |

* cited by examiner

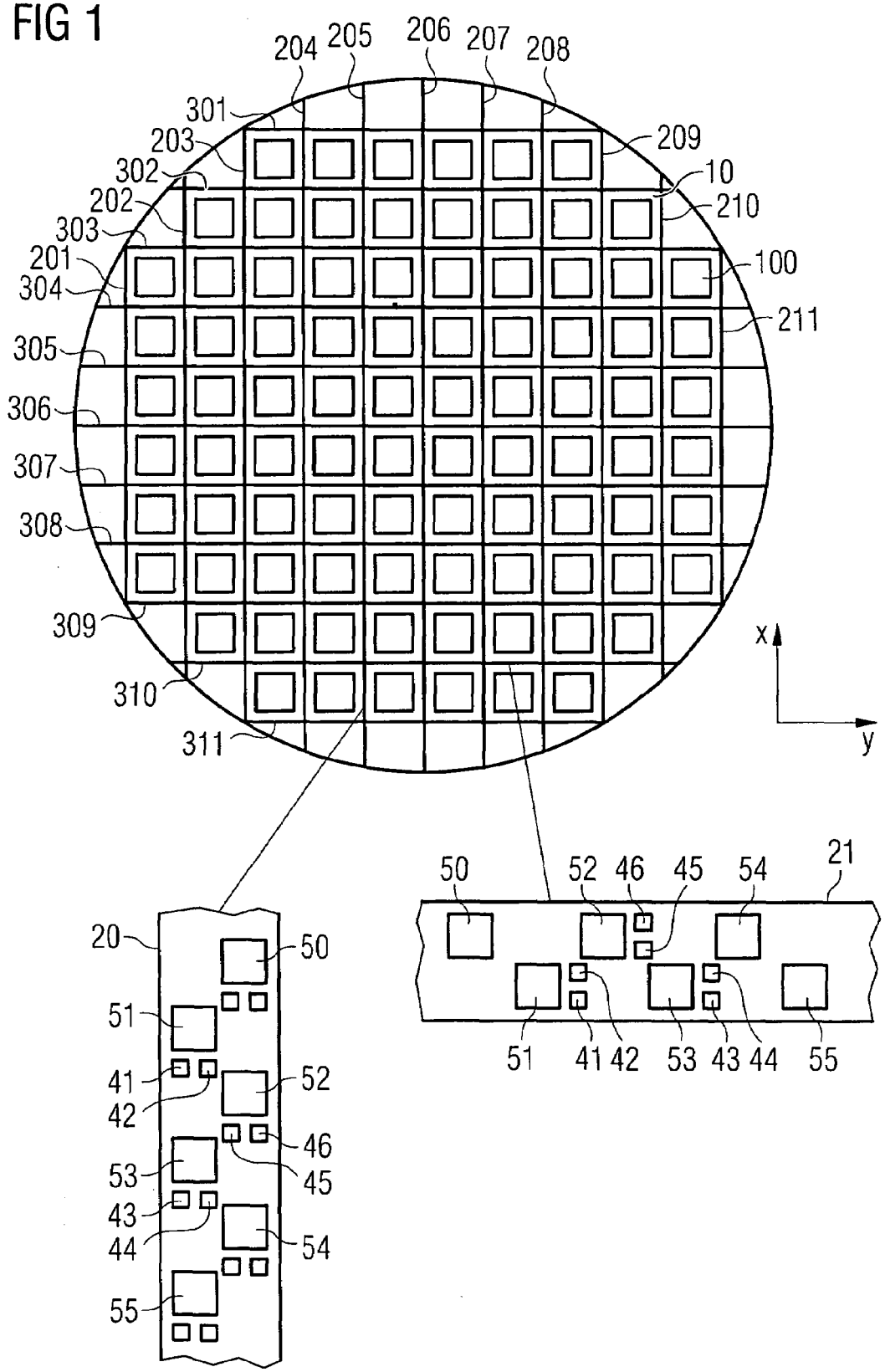

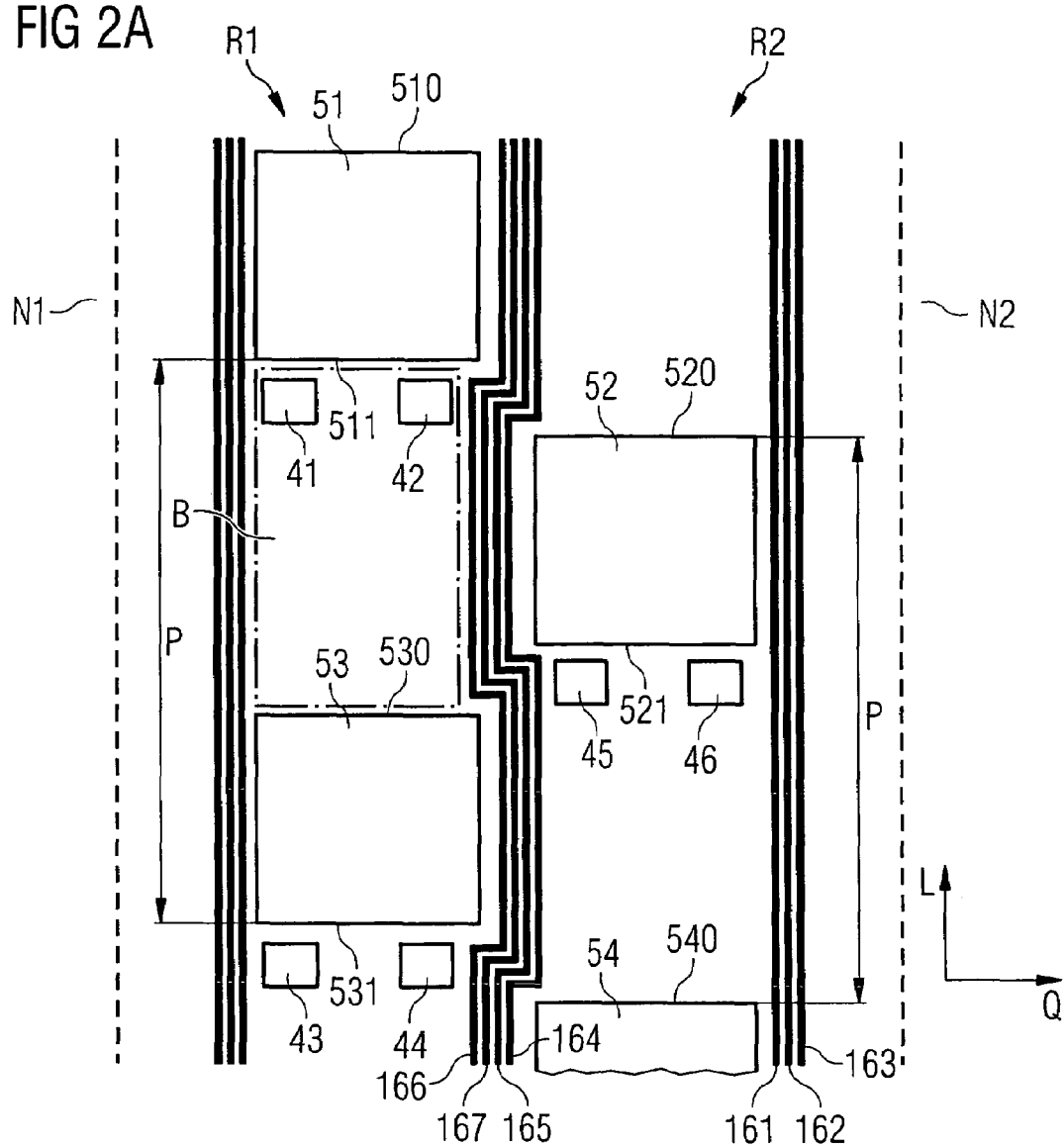
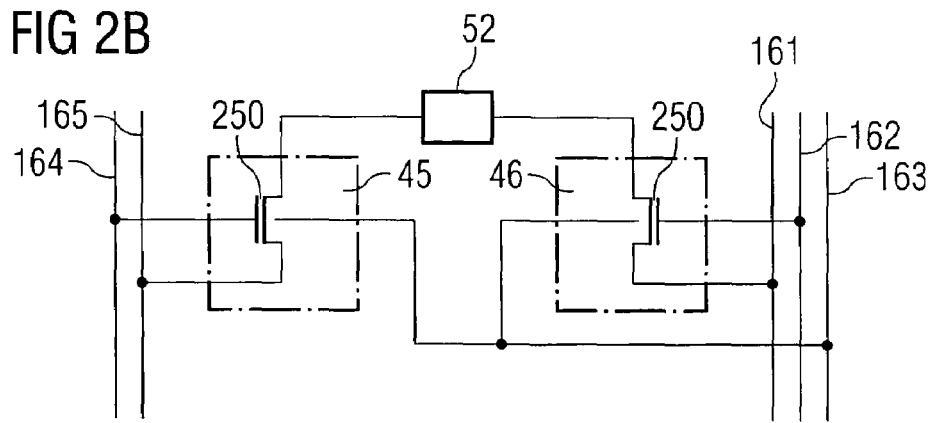

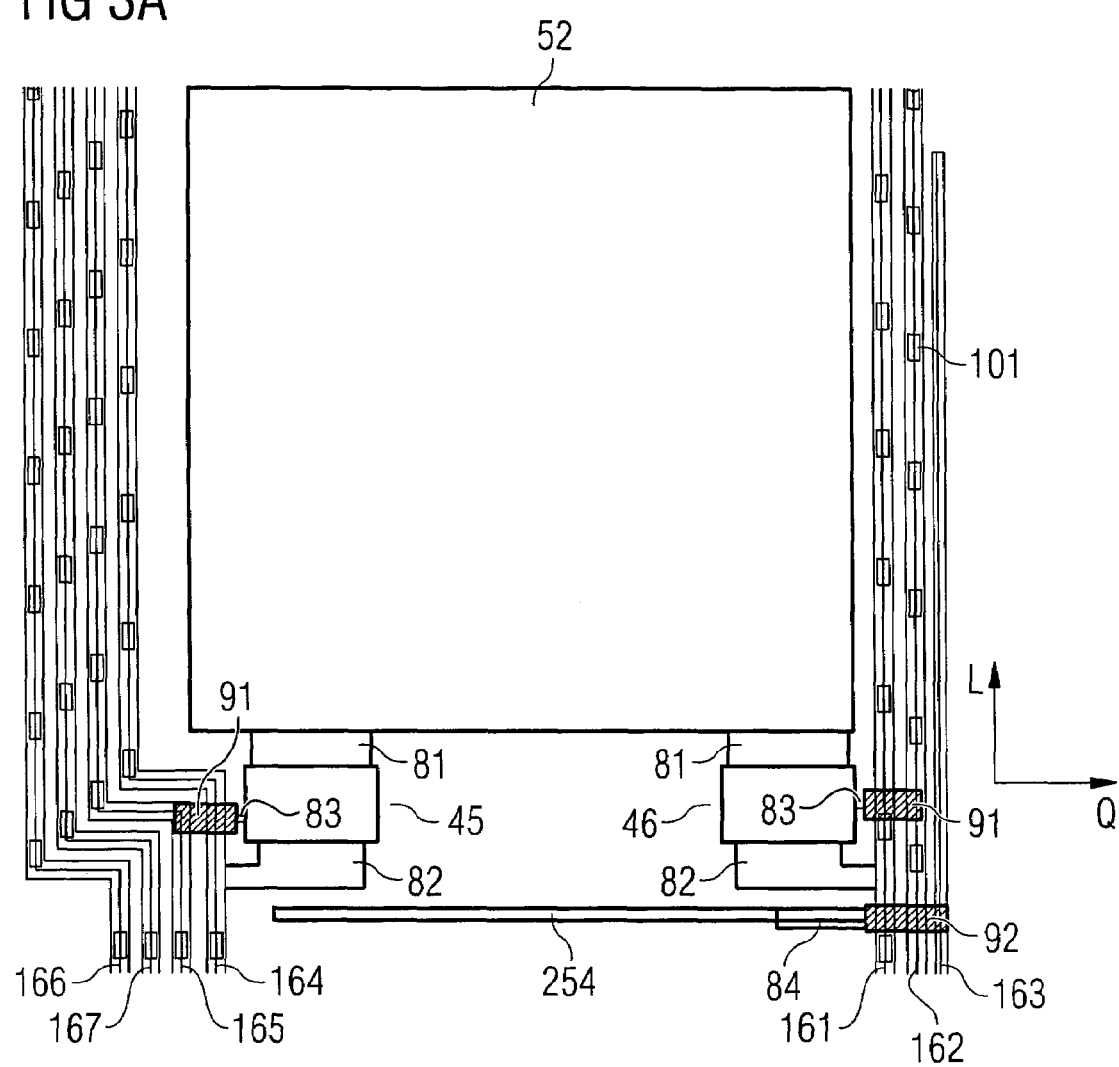

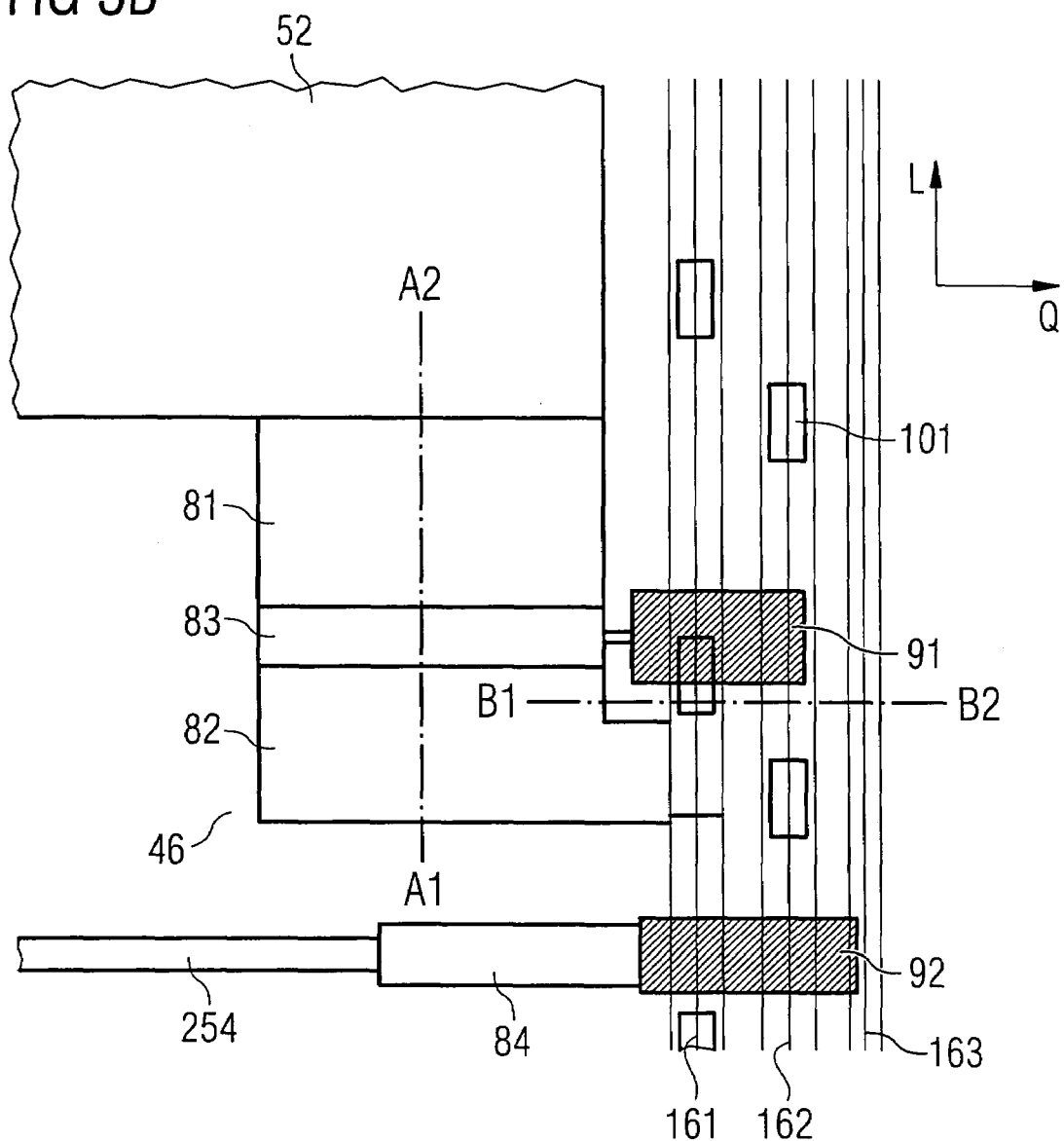

SEMICONDUCTOR WAFER WITH TEST STRUCTURE

This application claims priority to German Patent Application 10 2004 060 369.3, which was filed Dec. 15, 2004, and is incorporated herein by reference.

TECHNICAL FIELD

The invention relates to a semiconductor wafer having connection contacts that are connected to a test structure for determining electrical parameters.

BACKGROUND

A semiconductor wafer, also referred to as wafer, is usually used for fabricating semiconductor circuits. The wafer is subjected to a number of processing steps in order to form the semiconductor circuits.

After all the processing steps have been carried out, the wafer contains a large number of semiconductor circuits of identical type. These semiconductor circuits are arranged in rows and columns. The rows run in a first direction and the columns run in a second direction running transversely with respect to the first direction. The semiconductor circuits of a row are arranged at regular intervals along the first direction. The semiconductor circuits of a column are arranged at regular intervals along the second direction. The wafer contains a two-dimensional array of semiconductor circuits.

As illustrated in U.S. Pat. No. 5,838,163, which is incorporated herein by reference, by way of example, a wafer additionally comprises first sawing regions, which extend over the wafer in the first direction, and second sawing regions, which extend over the wafer in the second direction and cross the first sawing regions. A respective one of the semiconductor circuits is arranged between respective adjacent first sawing regions and respective adjacent second sawing regions. The first sawing regions and the second sawing regions together form the sawing frame or scribing frame, which is also referred to as kerf.

For singulating the semiconductor circuits, the wafer is sawn up along separating regions, which in each case run within a first sawing region or within a second sawing region through the wafer. A large part of the sawing frame is thus destroyed during the singulation of the semiconductor circuits.

Test structures are often formed within the sawing frame, for example additional semiconductor components or semiconductor circuits. Measurements are carried out on the test structures during the fabrication of the wafer. For making contact with the test structures, connection contacts that are conductively connected to the test structures are formed in the sawing frame. By way of example, U.S. Pat. No. 5,059,899, which is incorporated herein by reference, describes test circuits arranged in the sawing frame and connection contacts connected to the test circuits.

U.S. Patent Application Publication No. 2003/0034558 A1, which is incorporated herein by reference, describes an arrangement of test structures for identifying latent defects of a multilayer wiring structure that is formed on a semiconductor wafer. The test structures are arranged within sawing regions running along a first direction. One portion of the test structures is arranged in a first row, and a further portion of the test structures is arranged in a second row, the first row and the second row being offset along a second direction running transversely with respect to the first direction. First connection elements and second connection elements of individual test structures are arranged offset.

U.S. Patent Application Publication No. 2003/0006795 A1, which is incorporated herein by reference, describes test element groups (TEG) arranged in sawing regions of a semiconductor substrate. The TEGs are arranged between guard bands (GB). Each individual TEG comprises a respective source, drain and gate contact. The source, drain and gate contacts are arranged in a respective row running along the GBs, the row in which the gate contacts are arranged being offset along a second direction, which runs transversely with respect to the direction prescribed by the GBs, relative to the rows in which the source and drain contacts are arranged.

U.S. Patent Application Publication No. 2001/0035762 A1, which is incorporated herein by reference, discloses an arrangement of MIS transistors arranged in sawing regions of a semiconductor wafer. Each MIS transistor comprises source, drain and gate contacts, the source and drain contacts being arranged in a first row running along a first direction, and the gate contacts being arranged in a second row running along the first row, and the second row being offset along a second direction running transversely with respect to the first direction.

U.S. Pat. No. 6,124,143, which is incorporated herein by reference, describes an arrangement of a process monitoring construction, in which bonding pads are arranged at the periphery of an integrated circuit. Sawing regions are arranged between the bonding pads of adjacent integrated circuits, supplementary metal lines that are used for test purposes running between the bonding pads and the sawing regions. The supplementary metal lines are connected to a process monitor situated on the integrated circuit.

U.S. Pat. No. 6,177,733 B1, which is incorporated herein by reference, describes a test arrangement in which five electrode pads are arranged in such a way that four of the electrode pads form a rectangle and the fifth electrode pad is situated in the center of the rectangle. A multiplicity of semiconductor elements are arranged between the electrode pads and connected to each of the five electrode pads.

U.S. Pat. No. 5,923,047, which is incorporated herein by reference, describes an arrangement of test pads arranged in sawing regions of a semiconductor wafer. A first portion of the test pads is arranged in a row running along a sawing region. A further portion of the test pads is arranged in a row likewise running along the sawing region, the second row being offset along a direction running transversely with respect to the direction of the sawing region. Each test pad is connected to a respective pad situated on a chip.

U.S. Pat. No. 5,627,101, which is incorporated herein by reference, describes test structures arranged in sawing regions of a wafer. The test structures in each case have two first pads—arranged in a first row running along a first direction—for applying a current to the test structure. Furthermore, the test structure comprises two second pads for measuring a voltage, which are arranged in a second row, which runs along the first direction, and in the case of which a connection contact of the first row and a connection contact of the second row have edges that overlap as seen in the first direction.

Contact is made with the test structures by placing test needles of a needle card onto the connection contacts. The test needles are usually arranged in a row on the needle card. The tips of two adjacent test needles in each case have a standard spacing of 80 μm. The connection contacts in the sawing frame are likewise arranged in a row. In this case, a longitudinal direction of the row runs along the first direction or along the second direction of the sawing regions. The front edges—relative to the longitudinal direction—of adjacent connection contacts in each case have the same spacing as the tips of adjacent test needles.

The area of the sawing region is always chosen to be as small as possible in order to make as much area of the wafer as possible available for the semiconductor circuits of the chips. Nevertheless, as many test structures and connection contacts for making contact with the test structures as possible are to be arranged in the sawing region. In this case, the area requirement for the connection contacts is usually higher than the area requirement for the test structures.

During the measurement of an electrical parameter, a predetermined current flows through the cross-sectional area of a test needle. A heating of the test needle is dependent on the current density relative to the cross-sectional area. A test needle with a smaller cross-sectional area is, therefore, heated to a greater extent by the same current than a test needle with a larger cross-sectional area. This means that the cross-sectional area of the test needle cannot be reduced all that much if excessively great heating of the test needle is to be avoided.

The connection contacts are compressed into their width somewhat upon placement of the test needles. This means that the distance between mutually facing edges of adjacent connection contacts cannot be reduced all that much if a short circuit of the adjacent connection contacts upon placement of the test needles is to be avoided.

SUMMARY OF THE INVENTION

In one aspect, the invention arranges a largest possible number of test structures for monitoring electrical parameters of semiconductor elements on a predetermined area of the wafer.

In a first embodiment, a semiconductor wafer includes a plurality of first sawing regions running in a first direction and also a plurality of second sawing regions running in a second direction, the second direction running transversely with respect to the first direction. The semiconductor wafer also includes useful regions that each contain an integrated circuit and are arranged between respective adjacent first sawing regions and respective adjacent second sawing regions. For singulating the semiconductor circuits, the wafer is sawn up along the sawing regions.

At least one test structure region, in which test structures are formed, is arranged in at least one of the first and/or second sawing regions. The test structures are suitable for providing a signal representing an electrical parameter. The electrical parameter is determined repeatedly, under certain circumstances, during the processing of the wafer in order to identify alterations at the test structure. The electrical parameter is thus used for process monitoring.

Connection contacts that are connected to the test structures and are externally accessible are arranged in the test structure region. The connection contacts are preferably formed such that they are of identical type. The connection contacts are arranged in at least two rows running in a longitudinal direction. In this case, the connection contacts of a respective row have edges that are oriented to the longitudinal direction. In a transverse direction running transversely with respect to the longitudinal direction, the connection contacts of the first row the connection contacts of the second row are offset relative to one another. In the first sawing regions, the longitudinal direction matches the first direction. In the second sawing regions, the longitudinal direction matches the second direction.

As a result of the connection contacts being offset in the longitudinal direction, the dimensioning of a connection contact in the transverse direction may be relatively large. It may, for example, amount to more than half of the width of the sawing region. Therefore, the cross section of the test needles of a needle card does not have to be reduced all that much, with the result that the heating of the test needles is kept within limits even though the number of test structures per length of the sawing frame is doubled on account of the two-row arrangement.

As a result of the connection contacts being offset in the transverse direction, the full pitch is maintained in outer regions of the two-row arrangement. If the test needles are placed onto the connection contacts in these outer regions, a short circuit between adjacent connection contacts of a row does not arise even when the connection contacts are compressed into their width somewhat.

The connection contacts of a respective one of the rows are preferably arranged on a periodic grid with a predetermined grid dimension. The grid dimension is also referred to as pitch.

The connection contacts of the first and second rows in each case have an edge. The spacing between the edges of respective adjacent connection contacts is predetermined. The edges are mutually corresponding equivalent edges, for example front or rear edges of the connection contacts relative to the longitudinal direction of the respective row. Thus, by way of example, the spacing between front or rear edges of adjacent connection contacts is predetermined.

The spacing between the edges of adjacent connection contacts of the first row, which correspond to one another in terms of their relative position within the respective connection contacts, is preferably equal to the spacing of the equivalent edges of adjacent connection contacts of the second row.

The connection contacts of the first and second rows are thus arranged on periodic grids with the same grid dimension.

A first one of the test structures is preferably connected to a first one of the connection contacts of the first row. A second one of the test structures is preferably connected to a first one of the connection contacts of the second row.

The first one of the test structures is preferably arranged in a region surrounded by two respective adjacent connection contacts of the first row and one of the connection contacts of the second row.

A third test structure is preferably connected to the first one of the connection contacts of the first row.

A first line is preferably connected to the first one of the connection contacts of the first row, the first one of the test structures and the third one of the test structures. The first line preferably runs between one of the connection contacts of the first row and that one of the useful regions that is arranged closest to the connection contact.

A second line is preferably connected to the first one of the connection contacts of the first row, the first one of the test structures and the third one of the test structures and runs between one of the connection contacts of the first row and one of the connection contacts of the second row.

If lines are led on both sides of the two rows and also between the first row and the second row, then lines run past each region arranged between adjacent connection contacts of one of the rows on both sides. Those lines that face the region on both sides may in each case be contact-connected at low resistance by means of a contact bridge made of metal and a via. By contrast, the rest of the lines have to be contact-connected by means of a total of three vias, a contact bridge made of metal and a contact bridge made of polysilicon. A connection contact of the first row and a connection contact of the second row may have edges that overlap as seen in the first direction. The connection contacts of the first and second rows are then offset in the transverse direction by less than the width of a connection contact.

In the sawing region, a third line is preferably provided and the first one of the test structures preferably contains a transistor. The transistor comprises a first doping region, a second doping region and gate electrode. The first doping region is connected to one of the connection contacts. The second doping region may be connected to the first line or the second line. The gate electrode is connected to the third line.

The second line may have first sections running in the longitudinal direction and second sections running in the transverse direction, the second sections running in the transverse direction in each case are arranged between one of the connection contacts of the first row and one—facing the one of the connection contacts—of the connection contacts of the second row.

The first and/or second line may be formed from a plurality of sections, a first one of the sections running in a first metallization plane and a second one of the sections running in a second metallization plane, which lies below or above the first metallization plane.

There may be arranged between one of the edges—facing a useful region—of the connection contacts of one of the rows and the useful region a connection contact of the other of the rows. In this case, therefore, the connection contacts of the first and second rows are arranged in non-overlapping fashion as seen in the longitudinal direction.

BRIEF DESCRIPTION OF THE DRAWINGS

The invention is explained below with reference to schematic figures, which are not true to scale.

FIG. 1 shows a wafer with enlargements of sections of the sawing frame;

FIG. 2A shows a further enlarged section of the sawing frame with connection contacts, test structures and lines;

FIG. 2B shows a configuration of the interconnection of a connection contact with two test structures;

FIGS. 3A and 3B show further enlarged details from the sawing frame with a connection contact, the lines and a test structure connected to the connection contact and the lines;

Figure 2C:
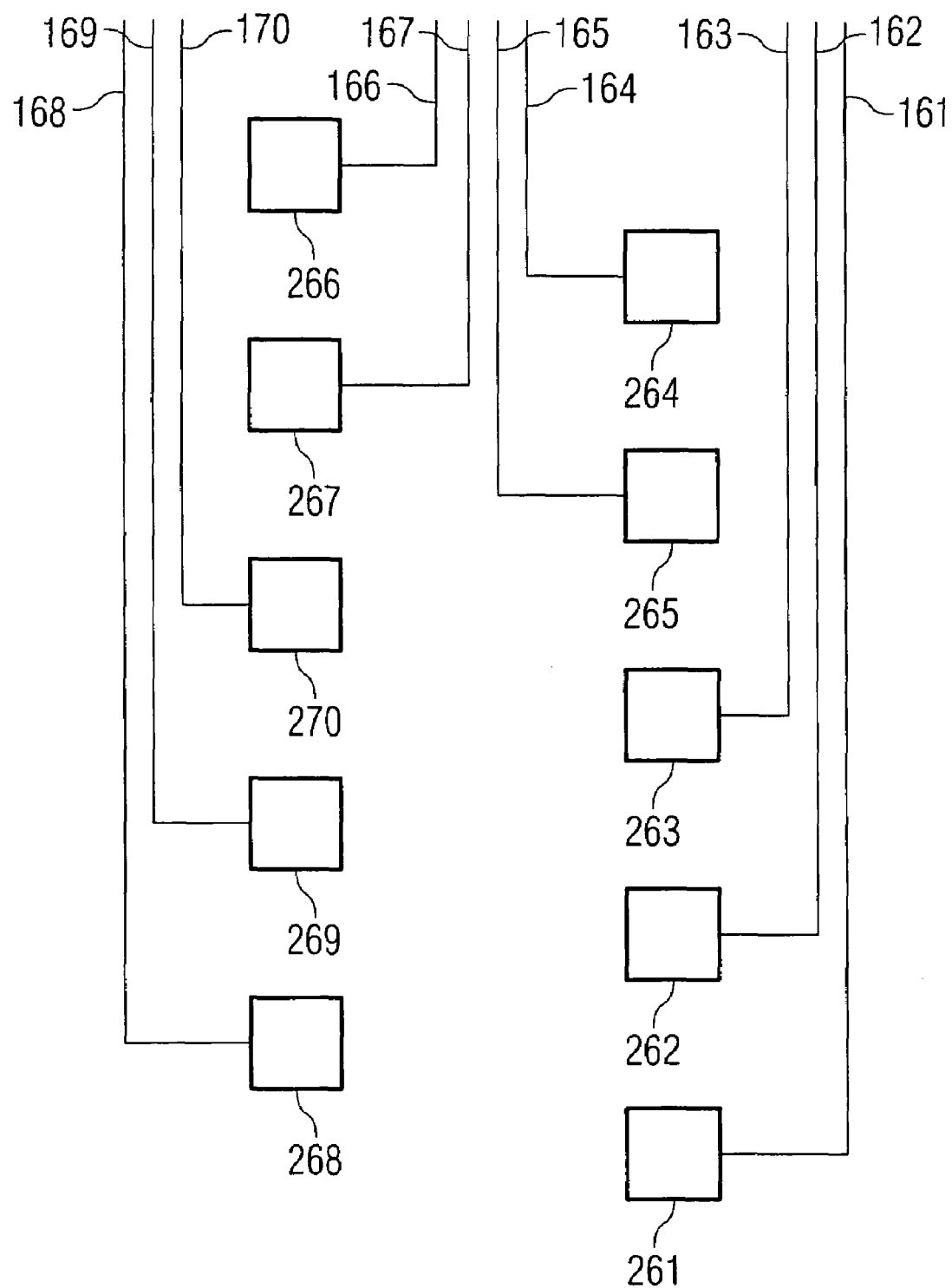
FIG. 2C shows connection contacts that are directly connected to the first and second lines in order to apply a voltage thereto.

The following list of reference symbols can be used in conjunction with the figures:

| 1 | Semiconductor wafer, wafer | M0 | First connecting layer |
|---|---|---|---|
| 10, N1, N2 | Useful region | C1 | Second dielectric layer |
| | | M1 | Second connecting layer |
| | | C2 | Third dielectric layer |

-continued

| 100 | Integrated circuit | M2 | Third connection layer |
|---|---|---|---|
| 201-211 | First sawing region | 81-84 | M0 Contact bridge |
| 301-311 | Second sawing region | 90 | Bridge insulation |
| | | 91-93 | C0 contact bridge |
| 41-46 | Test structure | 101 | Vertical contact (via) |
| 50-56 | Connection contact | 161-170 | Line |
| 71 | Test structure | 261-270 | Connection contact |
| 250 | Transistor | R1 | First row of connection contacts |
| 251 | Source region | | |
| 252 | Drain region | R2 | Second row of connection contacts |
| 253 | Gate electrode | | |
| 254 | Contact well | B | Region |
| AA | Substrate layer | P | Pitch, grid dimension |
| C0 | First dielectric layer | | |

DETAILED DESCRIPTION OF ILLUSTRATIVE EMBODIMENTS

FIG. 1 illustrates a wafer 1. Such a wafer 1 is fabricated by subjecting a semiconducting substrate to a number of processing steps. The processing steps comprise, for example, whole-area deposition of layers made of conducting, semiconducting and dielectric materials, whole-area deposition and exposure of photoresist layers, etching of regions of the photoresist layers in order to produce photoresist masks and etching of regions of the layers using the photoresist masks in order to produce structure elements or hard masks for forming structure elements.

The exposure of the photoresist layers is in each case carried out in a plurality of exposure steps. In each exposure step, an exposure zone of the wafer is in each case exposed using the reticle.

After all the processing steps have been carried out, the same semiconductor structure is formed in each of the exposure zones of the wafer. The semiconductor structure of an exposure zone comprises, for example, a plurality of semiconductor circuits of identical type for chips and regions of the sawing frame by means of which the semiconductor circuits are spaced apart from one another. The semiconductor structure of an exposure zone may have, for example, two rows and three columns of semiconductor circuits of identical type. The semiconductor structure may also comprise test structures formed in the regions of the sawing frame. The test structures may be arranged arbitrarily in the regions of the sawing frame.

Apart from the semiconductor circuits 100, the wafer also comprises first sawing regions 201-211, which extend over the entire wafer 1 in the first direction X, and second sawing regions 301-311, which extend over the entire wafer 1 in the second direction Y and cross the first sawing regions 201-211. A respective one of the semiconductor circuits 100 is arranged between respective adjacent first sawing regions 201-211 and respective adjacent second sawing regions 301-311. The first sawing regions 201-211 and the second sawing regions 301-311 together form the sawing frame or scribing frame, which is also referred to as kerf.

For singulating the semiconductor circuits 100, the wafer 1 is sawn up along separating regions that, in each case, run within a first sawing region 201-211 or within a second sawing region 301-311 through the wafer 1. A large part of the sawing frame is thus destroyed during the singulation of the semiconductor circuits 100.

Test structures 41-46 are formed both in the first sawing regions 201-211 and in the second sawing regions 301-311.

For making contact with the test structures 41-46, connection contacts 51-53 that are conductively connected to the test structures 41-46 are additionally formed in the sawing frame.

The test structures 41-46 are suitable for monitoring electrical parameters during the processing of the wafer 1. The parameters are used for process monitoring. If, on the basis of the parameters, alterations in the test structures are ascertained that lead to the supposition that defects have occurred in the semiconductor circuits 100, then the further processing of the wafer 1 can be set or modified.

The first sawing regions 201-211 and the second sawing regions 301-311 in each case extend in a longitudinal direction L over the entire wafer and in a transverse direction Q—running transversely with respect to the longitudinal direction L—over a specific width that is less than the spacing between mutually facing edges of the semiconductor circuits 100. For the first sawing regions 201-211, the longitudinal direction L is the first direction X and the transverse direction Q is the second direction Y. For the second sawing regions 301-311, the longitudinal direction is the second direction Y and the transverse direction Q is the first direction X.

FIG. 2A illustrates a detail from a sawing region. The sawing region may be one of the first sawing regions 201-211 or one of the second sawing regions 301-311. The width of the sawing region as measured in the transverse direction Q is 76 μm, for example. The connection contacts 51-53 of the test structures 41-46 have for example a length of 30 μm in the longitudinal direction L and a width of 44 μm in the transverse direction Q. The average spacing between an edge of the sawing region and an edge—facing this edge—of one of the connection contacts is then 18 μm. For example, the smaller spacing may be 13.75 μm and the larger spacing may be 22.25 μm. The spacing between mutually facing edges of adjacent connection contacts of a respective one of the rows is 50 μm. The area of a first sawing region between two connection contacts of one of the rows in which test structures can be accommodated amounts to approximately 50 μm×8.5 μm.

Two rows R1 and R2 of connection contacts are arranged in the sawing region. The first row R1 comprises, in particular, the connection contacts 51 and 53 and the test structures 41 to 44. The second row R2 comprises, in particular, the connection contacts 52 and 54 and the test structures 45 and 46. Relative to the longitudinal direction L, front and rear edges of the connection contacts can be defined in both rows. The spacing of the front edges 510 and 530 of the two adjacent connection contacts 51 and 53 of the first row R1 is P. The spacing of the front edges 520 and 540 of the two adjacent connection contacts 52 and 54 of the second row R2 is likewise P. The two connection contacts 41 and 42 are arranged in the region B surrounded by the two adjacent connection contacts 51 and 53 of the first row R1 and the connection contact 52 of the second row R2. Each of the two rows R1 and R2 faces respective adjacent useful regions N1 and N2. First lines 161-163 and 168-170 run between, in each case, one of the rows R1 and R2 and those of the useful regions N1 and N2, which the respective one of the rows R1 and R2 faces. Second lines 164 to 167 run between the two rows R1 and R2. In general, the lines 161 to 170 are, in each case, connected to further test structures and to a further connection contact. A voltage can in each case be applied to the lines 161-170 via the further connection contact.

FIG. 2B illustrates the interconnection of the test structures 45 and 46 with the connection contact 52 of the second row R2, the first conductor paths 161 to 163 and the second conductor paths 164 and 165. The test structures 45 and 46 contain field effect transistors 250 in this case. The drain regions of the transistors 250 are connected to the connection contact 52. The source region of the transistor 250 of the test structure 45 is connected to the line 165. The source region of the transistor 250 of the test structure 46 is connected to the line 161. The gate electrode of the transistor 250 of the test structure 45 is connected to the line 164. The gate electrode of the transistor 250 of the test structure 46 is connected to the line 161. The contact well 254 of the transistors 250 is connected to the line 163.

FIG. 2C illustrates the interconnection of the lines 161-170 with respective connection contacts 261-270. A voltage can be applied to the connected one of the lines 161-170 via a respective one of the connection contacts 261 to 270. Since each of the lines is, in each case, connected to a plurality of test structures, a voltage can thus be applied to a plurality of test structures via each of the connection contacts.

FIGS. 3A and 3B in each case illustrate enlarged details around the connection contact 52. The test structures 45 and 46 are connected via the contact bridges 81 to the connection contact 52 and via the contact bridges 82 to the lines 164 and 161, respectively. Moreover, the test structures 45 and 46 are connected via, in each case, a combination of contact bridges 83 and 91 to the lines 165 and 162, respectively. The contact well 254 for making contact with a, for example p-conducting well of the test structures 45 and 46 is connected to the line 163 via a combination of contact bridges 84 and 92. The test structures 45 and 46 may be field effect transistors 250, for example. The contact bridges 81 to 84 may be lines of a connecting layer. The contact bridges 91 and 92 may be layers of doped polysilicon running in a dielectric layer. In each case one of the contact bridges 81 to 83 and one of the contact bridges 91 and 92 run in different layers of the wafer. The contact bridges 91 and 92 and the lines 161-170 likewise run in different layers or planes of the wafer and can, therefore, cross in contact-free fashion. The lines 161 to 170 comprise, for example, conductor paths that run one above the other in a plurality of connecting layers and are conductively connected by vertical contacts (vias) 101.

Figure 4:
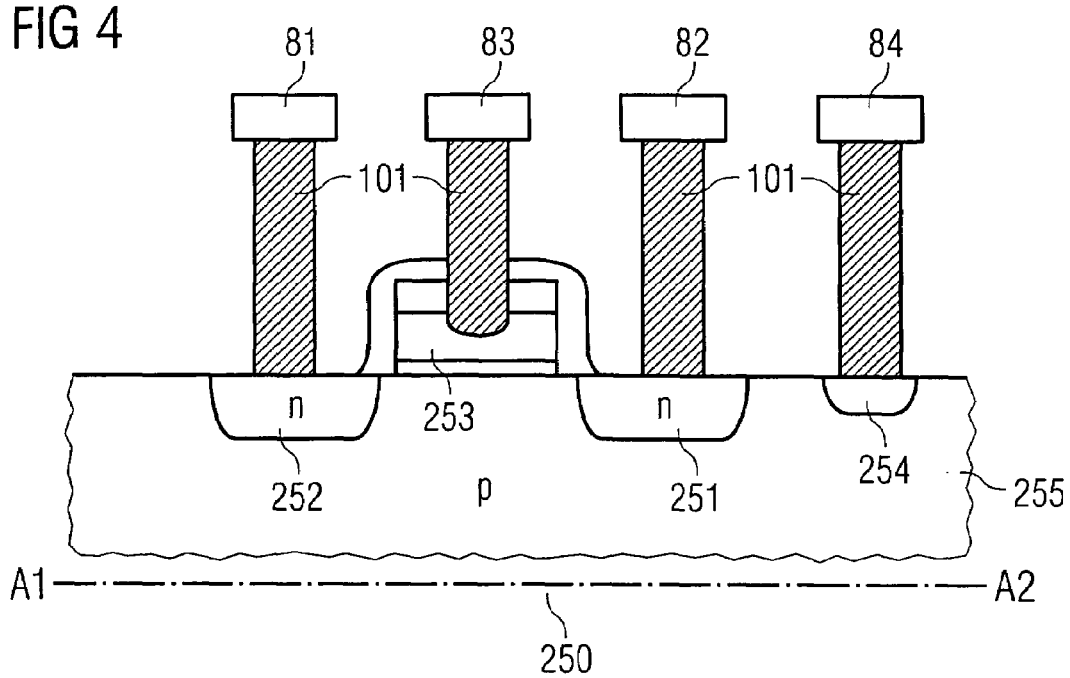
FIG. 4 shows a cross-sectional view along the sectional plane A1-A2 through the test structure of FIG. 3B and the contact-connection of the test structure from the M0 layer.

FIG. 4 illustrates a field effect transistor 250. The field effect transistor 250 may be contained, for example, in the test structure 46 from FIG. 3B. The view illustrated then results for a sectional plane—perpendicular to the paper plane—through the sectional line A1-A2. The source region 251 is connected to the contact bridge 82, the drain region 252 is connected to the contact bridge 81, the gate electrode 253 is connected to the contact bridge 83 and the contact well 254 is connected to the contact bridge 84. The contact bridges are electrically conductively connected to the semiconductor materials in each case by means of a vertical contact (via) 101.

Figure 5:
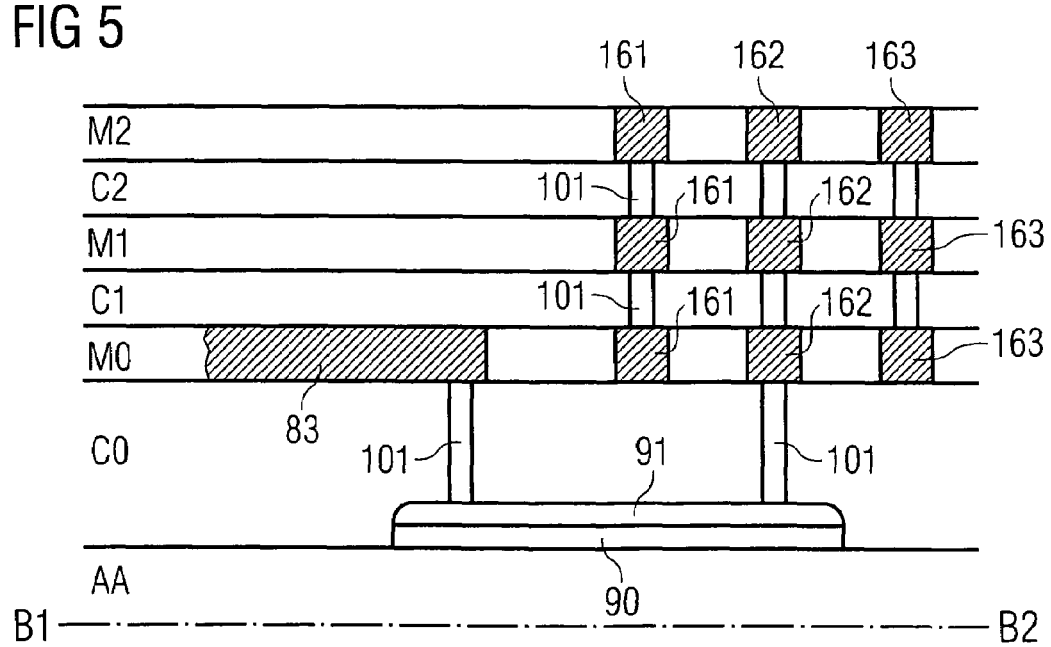
FIG. 5 shows a cross-sectional view along the sectional plane B1-B2 through the contact bridges to the lines from FIG. 3B.

FIG. 5 illustrates the sequence of the layers of the wafer 1. Above an active area AA of the substrate, a first dielectric layer C0, a first connecting layer M0, a second dielectric layer C1, a second connecting layer M1, a third dielectric layer C2 and a third connecting layer M2 have been applied one after the other in order to produce the layer sequence illustrated. In this case, a connecting layer also comprises dielectric regions alongside conductive regions. The conductive regions are preferably made of metal and form conductor paths, for instance. The dielectric regions serve for insulation and for planarization of the connecting layer.

Each of the lines 161, 162 and 163 comprises conductor paths in each of the connecting layers M0, M1 and M2, which are electrically conductively connected to one another by means of vertical contacts (vias). By means of the combination of contact bridges 83 and 91, the gate electrode 253 of the transistor 250 from FIG. 4 is connected to the line 162. The contact bridge 83 runs in the M0 layer and contains tungsten, for example. The contact bridge 91 runs in the dielectric layer C0 and contains doped polysilicon, for example. The contact bridge 91 can, therefore, cross the line 161 without an electrical contact arising. Analogously, the combination of contact bridges 84 and 92 for the contact-free crossing of the lines 161 and 162 that is illustrated in FIG. 3B comprises the contact bridge 84 running in the M0 layer and the contact bridge 92 running in the C0 layer.

Figure 6:
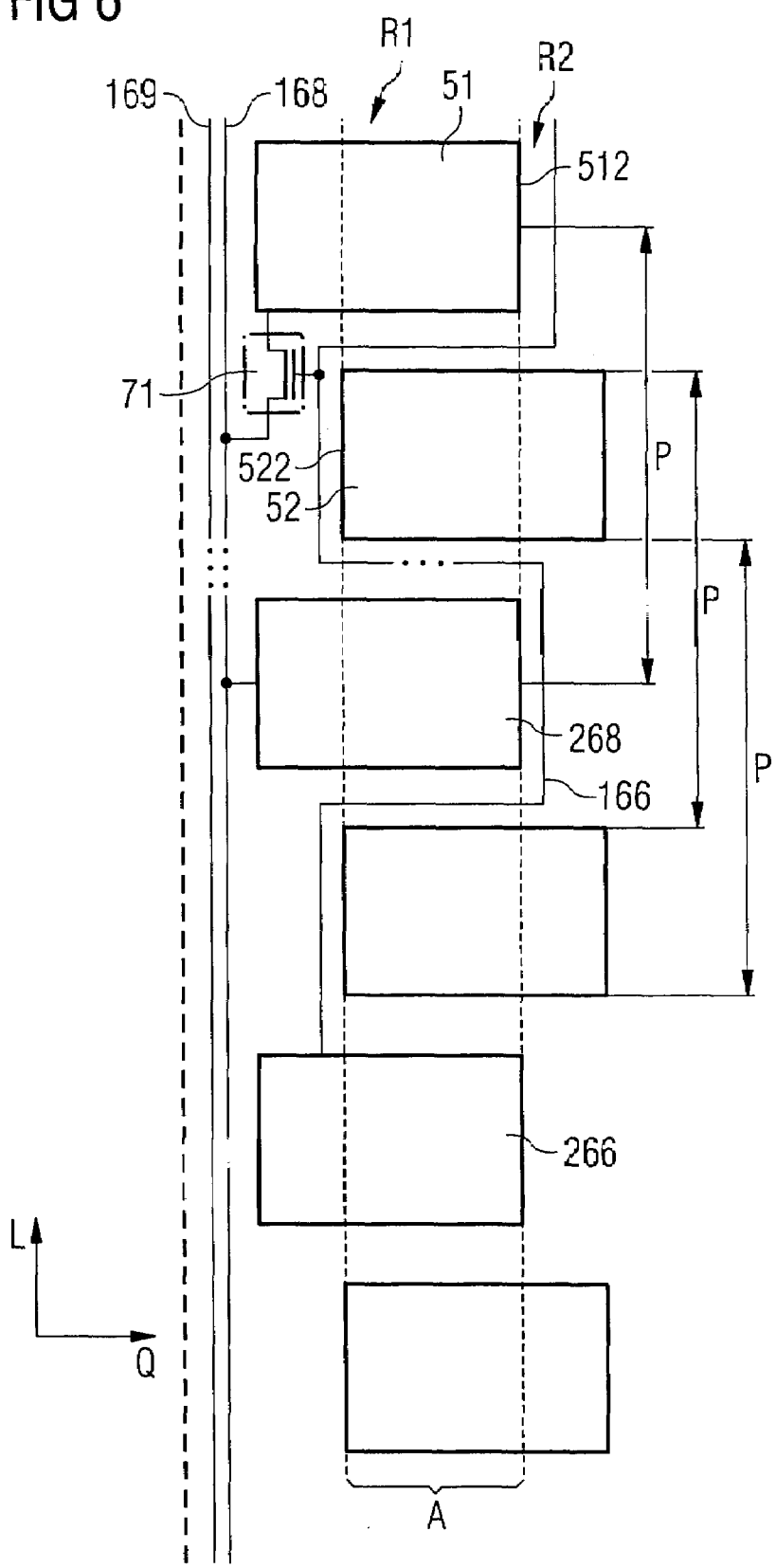
FIG. 6 shows an exemplary embodiment for an arrangement of connection contacts and lines.

FIG. 6 illustrates an alternative line routing for the connection of a test structure 71 to three connection contacts 51, 53 and 55 of the row R1. The test structure is once again a field effect transistor 254. The drain region is connected to the connection contact 51, the source region is connected to the connection contact 268 via the first line 168 and the gate electrode is connected to the connection contact 266 via the second line 166. The contact-connection of the gate electrode of the field effect transistor 250 via the second line 166, which runs between the rows R1 and R2, contains no contact bridge 91 made of doped polysilicon. Therefore, the gate electrode can be contact-connected at low resistance.

The rows illustrated in FIG. 6 additionally have connection contacts that have inner edges 512 and 522 that overlap as viewed in the longitudinal direction L. The rows of connection contacts can thus be arranged in a region whose width measured in the transverse direction Q is less than twice the width of a connection contact as measured in the transverse direction Q.

The invention is not restricted to the number of elements shown in the exemplary embodiments or a specific fashioning of these elements.

A test structure may be, as illustrated in the exemplary embodiments, in particular a transistor. However, a test structure may, for example, also be a spur line, a resistance element, two conductor paths arranged at a minimum distance from one another, a conductor path having a minimum width, a capacitor element, a memory cell or a semiconductor circuit.

What is claimed is:

1. A semiconductor wafer, comprising:
    a plurality of first sawing regions extending in a first direction;
    a plurality of second sawing regions extending in a second direction, the second direction extending transversely with respect to the first direction;
    a plurality of useful regions arranged between respective adjacent first sawing regions and respective adjacent second sawing regions, each useful region including an integrated circuit;
    test structures arranged in one of the first sawing regions and/or one of the second sawing regions, the test structures suitable for providing a signal representing an electrical parameter;
    connection contacts electrically connected to the test structures, the connection contacts being arranged in said one of the first sawing regions and/or one of the second sawing regions, one portion of the connection contacts being arranged in a first row running along a first direction, and a further portion of the connection contacts being arranged in a second row running along the first direction, the first row and the second row being offset along a second direction running transversely with respect to the first direction;
    a first one of the test structures electrically connected to a first one of the connection contacts of the first row and a second one of the test structures electrically connected to a first one of the connection contacts of the second row;
    a third test structure electrically connected to the first one of the connection contacts of the first row;
    a second line electrically connected to the first one of the connection contacts of the first row, the first one of the test structures and the third one of the test structures and extending between one of the connection contacts of the first row and one of the connection contacts of the second row, the second line having sections running in the first direction and sections running in the second direction, the sections running in the second direction in each case arranged between one of the connection contacts of the first row and one facing the one of the connection contacts of the connection contacts of the second row.

2. The semiconductor wafer as claimed in claim 1, wherein, in each case, two respective adjacent connection contacts of the first row have an edge on a respective side and the edges have a predetermined spacing.

3. The semiconductor wafer as claimed in claim 2, wherein, in each case, two respective adjacent connection contacts of the second row have an edge on a respective side and the edges likewise have the spacing.

4. The semiconductor wafer as claimed in claim 1, wherein the first one of the test structures is arranged in a region surrounded by two respective adjacent connection contacts of the first row and one of the connection contacts of the second row.

5. The semiconductor wafer as claimed in claim 1, further comprising a first line, which is electrically connected to the first one of the connection contacts of the first row, the first one of the test structures and the third one of the test structures and which runs between one of the connection contacts of the first row and that one of the useful regions which is arranged closest to said connection contact.

6. The semiconductor wafer as claimed in claim 5, wherein the first line is formed from a plurality of conductor paths, a first one of the conductor paths running on a first plane, a second one of the conductor paths running on a second plane that is arranged above or below the first plane, wherein the first and the second one of the conductor paths are electrically connected by contacts.

7. The semiconductor wafer as claimed in claim 5, wherein the first one of the test structures comprises a transistor, the transistor comprising:
    a first doped region coupled to one of the connection contacts;
    a second doped region coupled to the first line; and
    a gate electrode coupled to a third line.

8. The semiconductor wafer as claimed in claim 1, wherein a connection contact of the first row and a connection contact of the second row have edges that overlap as seen in the first direction.

9. The semiconductor wafer as claimed in claim 1, wherein the first test structure comprises a transistor, the transistor comprising:
    a first doped region coupled to one of the connection contacts;
    a second doped region coupled to the second line; and
    a gate electrode coupled to a third line.

10. The semiconductor wafer as claimed in claim 1, wherein there is arranged between one of the edges, facing a useful region, of the connection contacts of one of the rows and said useful region a connection contact of the other of the rows.

11. A semiconductor wafer, comprising:
a plurality of useful regions separated by a sawing region, each useful region including an integrated circuit;
a plurality of connection contacts disposed in the sawing region, a first group of the connection contacts arranged in a first row extending along a first direction, and a second group of the connection contacts arranged in a second row extending along the first direction, the first row and the second row being offset along a second direction running transversely with respect to the first direction;
a first test structure disposed in the sawing region and electrically connected to a first one of the connection contacts of the first row;
a second test structure disposed in the sawing region and electrically connected to a first one of the connection contacts of the second row;
a third test structure electrically connected to the first one of the connection contacts of the first row;
a second line electrically connected to the first one of the connection contacts of the first row, the first test structure and the third test structure, the second line extending between one of the connection contacts of the first row and one of the connection contacts of the second row, the second line having a section running in a longitudinal direction and a section running in a transverse direction, the sections running in the transverse direction arranged between one of the connection contacts of the first row and a contact facing the one of the connection contacts of the second row.

12. The semiconductor wafer as claimed in claim 11, wherein two adjacent connection contacts of the first row have an edge on a respective side and the edges have a predetermined spacing and wherein two adjacent connection contacts of the second row have an edge on a respective side and the edges have the spacing.

13. The semiconductor wafer as claimed in claim 11, wherein the first test structure is surrounded by two adjacent connection contacts of the first row and one of the connection contacts of the second row.

14. The semiconductor wafer as claimed in claim 11, further comprising a first line electrically connected to the first one of the connection contacts of the first row, the first test structure and the third test structure, the first line extending between one of the connection contacts of the first row and that a useful region that is arranged closest to said one of the connection contacts of the first row.

15. The semiconductor wafer as claimed in claim 14, wherein the first line is formed from a plurality of interconnects, a first one of the interconnects running on a first plane, a second one of the interconnects running on a second plane that is arranged above or below the first plane, wherein the first and the second one of the interconnects are electrically connected by contacts.

16. The semiconductor wafer as claimed in claim 14, wherein the first test structure comprises a transistor, the transistor comprising:
a first doped region coupled to one of the connection contacts;
a second doped region coupled to the first line; and
a gate electrode coupled to a third line.

17. The semiconductor wafer as claimed in claim 11, wherein the first test structure comprises a transistor, the transistor comprising:
a first doped region coupled to one of the connection contacts;
a second doped region coupled to the second line; and
a gate electrode coupled to a third line.

18. A method of making a semiconductor device, the method comprising:
fabricating a semiconductor wafer, the semiconductor wafer comprising:
a plurality of useful regions separated by a sawing region, each useful region including an integrated circuit;
a plurality of connection contacts disposed in the sawing region, a first group of the connection contacts arranged in a first row extending along a first direction, and a second group of the connection contacts arranged in a second row extending along the first direction, the first row and the second row being offset along a second direction running transversely with respect to the first direction;
a first test structure disposed in the sawing region and electrically connected to a first one of the connection contacts of the first row;
a second test structure disposed in the sawing region and electrically connected to a first one of the connection contacts of the second row;
a third test structure electrically connected to the first one of the connection contacts of the first row;
a second line electrically connected to the first one of the connection contacts of the first row, the first test structure and the third test structure, the second line extending between one of the connection contacts of the first row and one of the connection contacts of the second row, the second line having a section running in a longitudinal direction and a section running in a transverse direction, the sections running in the transverse direction arranged between one of the connection contacts of the first row and a contact facing the one of the connection contacts of the second row;
performing an electrical test utilizing the first test structure, the second test structure and the third test structure; and
singulating the semiconductor wafer into a plurality of dies, each of the dies including one of the useful areas.

19. The method as claimed in claim 18, wherein the semiconductor wafer further comprises a first line electrically connected to the first one of the connection contacts of the first row, the first test structure and the third test structure, the first line extending between one of the connection contacts of the first row and that a useful region that is arranged closest to said one of the connection contacts of the first row.

20. The method as claimed in claim 18, wherein performing an electrical test comprises contacting the semiconductor wafer with a probe needle.

* * * * *